(12) United States Patent
Chen et al.

(10) Patent No.: US 6,972,479 B2
(45) Date of Patent: Dec. 6, 2005

(54) PACKAGE WITH STACKED SUBSTRATES

(75) Inventors: Da-Jung Chen, Taoyuan County (TW); Tung-Yi Yang, Kaohsiung County (TW); Steven Liu, Hsinchu (TW)

(73) Assignee: Cyntec Co., Ltd., Hsinchu (TW)

( * ) Notice: Subject to any disclaimer, the term of this patent is extended or adjusted under 35 U.S.C. 154(b) by 44 days.

(21) Appl. No.: 10/710,201

(22) Filed: Jun. 25, 2004

(65) Prior Publication Data

US 2005/0205970 A1    Sep. 22, 2005

(30) Foreign Application Priority Data

Mar. 17, 2004    (TW) ............................ 93107050 A

(51) Int. Cl.[7] .......................................... H01L 23/495
(52) U.S. Cl. ...................................... 257/666; 257/724
(58) Field of Search ............................. 257/666, 676, 257/777, 723, 724, 787, 691

(56) References Cited

U.S. PATENT DOCUMENTS

| | | | |
|---|---|---|---|
| 6,144,571 A | 11/2000 | Sasaki et al. | 363/144 |
| 6,163,076 A * | 12/2000 | Lee et al. | 257/777 |
| 6,190,944 B1 * | 2/2001 | Choi | 438/109 |
| 6,313,598 B1 | 11/2001 | Tamba et al. | 318/722 |
| 6,507,098 B1 * | 1/2003 | Lo et al. | 257/686 |
| 6,572,387 B2 * | 6/2003 | Burns et al. | 439/69 |
| 6,574,107 B2 | 6/2003 | Jeon et al. | 361/709 |
| 6,603,197 B1 * | 8/2003 | Yoshida et al. | 257/676 |
| 6,710,439 B2 * | 3/2004 | Lee et al. | 257/691 |
| 6,777,787 B2 * | 8/2004 | Shibata | 257/666 |
| 6,836,009 B2 * | 12/2004 | Koon et al. | 257/692 |

* cited by examiner

Primary Examiner—S. V. Clark
(74) Attorney, Agent, or Firm—Belinda Lee

(57) ABSTRACT

A package having a plurality of stacked substrates is provided. The package has at least two substrates. One substrate is stacked over the other to construct a three-dimensional circuit structure. Elements are disposed on the respective substrates. At least a conductive column is disposed between the two substrates. A lead-frame is connected to the substrates or the elements. The lead-frame also has a plurality of leads. The two neighboring substrates are electrically connected through the conductive column so that the average signal transmission length is shortened and the signal transmission quality is improved. Furthermore, the conductive column increases the mechanical strength of the package and reduces the degree of warping in the package so that a longer life span can be expected.

14 Claims, 2 Drawing Sheets

PACKAGE WITH STACKED SUBSTRATES

CROSS REFERENCE TO RELATED APPLICATIONS

This application claims the priority benefit of Taiwan application serial no. 93107050, filed on Mar. 17, 2004.

BACKGROUND OF INVENTION

1. Field of the Invention

The present invention relates to a package. More particularly, the present invention relates to a package with stacked substrates.

2. Description of Related Art

With great demands for light and compact electronic products, how to squeeze in the most circuits and elements within a small space is the goal of most package designer. In view of this trend, two-dimensional circuit and element layout no longer can satisfy our density requirements. The only solution is to upgrade the circuit and element layout to a three-dimensional design.

FIG. 1 is a schematic cross-sectional view showing the package of a conventional power module. The package 102 in FIG. 1 shows the power element 110a, the control element 110b and other elements (not shown) of the power module are disposed on the chip pads 122 of a lead-frame 120 and are electrically connected through wire bonding. In other words, the elements 110 (including the power element 110a, the control element 110b and other elements) are electrically connected to the lead-frame 120 through a set of conductive wires 130. The lead-frame 120 and the elements 110 are positioned on a heat sink 140. Thereafter, a molding compound 150 is used to seal off the elements 110, the conductive wires 130, part of the lead-frame 120 and part of the heat sink 140. Finally, the elements 110 are electrically connected to external devices through a set of leads 124 of the lead-frame 120.

It should be noted that the lead-frame 120 must have a definite thickness to provide the leads 124 with a sufficient mechanical strength. However, this limits to the density of circuit on the lead-frame 120. To increase the circuit density of the power module package 102, a substrate 160 (see FIG. 2) having a surface circuit and a high thermal dissipation rate is provided. The substrate 160 replaces the chip pads 122 and a portion of the circuit of the lead-frame 120 as well as the heat sink 140 in a conventional design.

FIG. 2 is a schematic cross-sectional view showing the package of another conventional power module. Instead of forming a circuit on the lead-frame 120 as in FIG. 1, the substrate 160 provides a circuit and dissipates the heat generated by the elements 110 as well. Otherwise, the package 104 in FIG. 2 is very similar to the one in FIG. 1. The power element 110a, the control element 110b and other element 110c of the power module are disposed on the substrate 160 and electrically connected to the substrate 160 through wire bonding. In other words, the elements 110, the lead-frame 120 and the surface circuit on the substrate 160 are electrically connected using a set of conductive wires 130. Thereafter, a molding compound 150 is used to encapsulate the elements 110, the conductive wires 130, part of the lead-frame 120 and part of the substrate 160. Finally, the elements 110 are electrically connected to external devices through a set of leads 124 of the lead-frame 120.

Because the power element and the control element of a power module are often put together inside the same package, the circuit layout within the power module is increasingly complicated. Furthermore, it does not matter much if the design is a combination of a lead-frame and a heat sink or just a high heat dissipating substrate, the circuit and elements within the power module package are still laid out in a two-dimensional format. Hence, the circuit layout density of the power module package is subjected to significant limitations. Furthermore, with a flat-out circuit and element layout design, the package area of a power module will increase because more complicated routing is needed. Since warping is positively related to the surface area of a package and the difference in coefficient of thermal expansion (CTE) between layers, two-dimension design has severe drawbacks. In addition, the elements, lead-frame and the substrate circuit within the power module are electrically connected using standard conductive wires. Thus, signal transmission requiring a higher current density is not supported.

SUMMARY OF INVENTION

Accordingly, The present invention is directed to a package with stacked substrates for increasing the mechanical strength and improving the electrical performance of the package.

According to an embodiment of the present invention, a package with stacked substrates is provided. The package comprises a first substrate having a surface; at least a first element connected to the surface of the first substrate; at least a conductive column one end of which is connected to the surface of the first substrate; a second substrate having a front surface and a back surface such that the back surface is connected to the other end of the conductive column and the that the second substrate and the first substrate are located at different levels; at least a second element connected to the front surface of the back surface of the second substrate; a lead-frame having at least a lead, a down-set portion and an up-set portion such that the down-set portion is connected to the first substrate and the up-set portion is connected to the second substrate; and a molding compound that encapsulates part of the first substrate, the first element, the conductive column, part of the second substrate and both the down-set portion and the up-set portion of the lead-frame.

Accordingly, the present invention deploys at least two overlapping substrates to form a three-dimensional circuit structure. A plurality of conductive columns is disposed between the substrates. A pair of neighboring substrates is electrically connected using the conductive columns. Hence, the average signal transmission path is shortened and the transmission quality of the package is improved. In addition, the conductive columns increase the mechanical strength of the package and lower the degree of warping in the package due to thermal stress. Thus, the package has a longer life.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
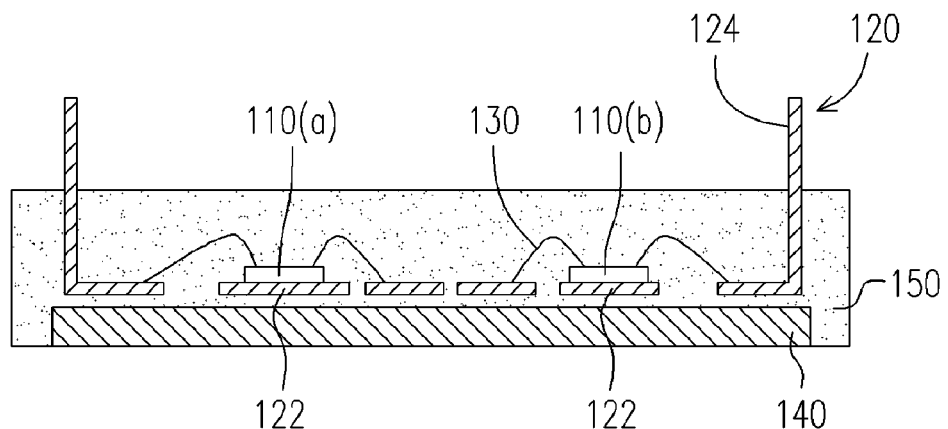
FIG. 1 is a schematic cross-sectional view showing a package of a conventional power module.
Figure 2:
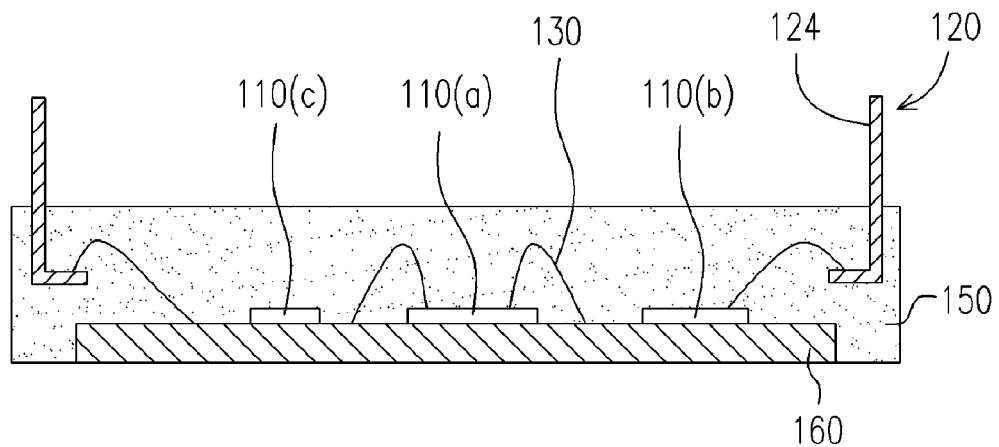
FIG. 2 is a schematic cross-sectional view showing a package of another conventional power module.

Reference will now be made in detail to the present preferred embodiments of the invention, examples of which are illustrated in the accompanying drawings. Wherever possible, the same reference numbers are used in the drawings and the description to refer to the same or like parts.

Figure 3:
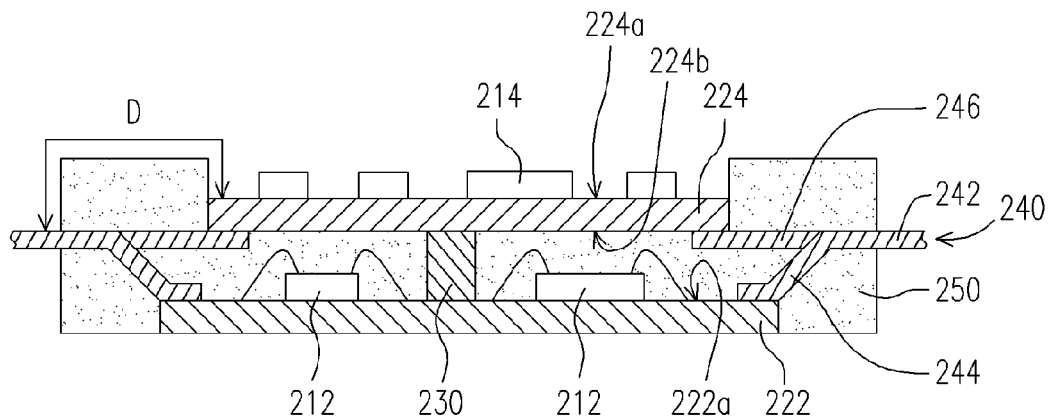
FIG. 3 is a schematic cross-sectional view of a package with stacked substrates according to an embodiment of the present invention.

FIG. 3 is a schematic cross-sectional view of a stacked substrate package according to an embodiment of the present invention. As shown in FIG. 3, the package 202 comprises a plurality of first elements 212, a plurality of second elements 214, a first substrate 222, a second substrate 224, a plurality of conductive columns 230 (only one is shown), a lead-frame 240 and a molding compound 250.

The first elements 212 can be power elements capable of generating large quantities of heat in operation, for example. The first elements 212 are disposed on a surface 222a of the first substrate 222. The first elements 212 are electrically connected to the surface 222a of the first substrate 222 by wire bonding, for example. However, the first elements 212 may also connect electrically with the first substrate 222 using surface mount technology (SMT). The surface mount technique includes a flip chip bonding method, for example. The second elements 214 can be control elements or passive elements attached to a front surface 224a (or a back surface 224b) of the second substrate 224 by using surface mount technology.

The surface 222a of the first substrate 222 has a circuit layer. The first substrate 222 can be a printed circuit board (PCB), a ceramic substrate, a direct copper bonding (DCB) substrate, a direct aluminum bonding (DAB) substrate or an insulated metal substrate (IMS). The insulated metal substrate (IMS) comprises a metal base layer, an insulation layer and a circuit layer. The insulation layer is sandwiched between the metal base layer and the circuit layer for isolating the two layers electrically. Compared with the first substrate 222 having just a single circuit layer, the second substrate 224 may have at least two electrically connected circuit layers, one on the front surface 224a and the other on the back surface 224b of the second substrate 224. In addition, the second substrate 224 can be a printed circuit board (PCB), a ceramic substrate, a direct copper bonding (DCB) substrate, a direct aluminum bonding (DAB) substrate or an insulated metal substrate (IMS) as well.

The bottom end of the conductive column 230 is electrically and mechanically connected to the surface 222a of the first substrate 222 by soldering. Similarly, the top end of the conductive column 230 is electrically and mechanically connected to the back surface 224b of the second substrate 224 by soldering. Therefore, supported by the conductive column 230, the first substrate 222 and the second substrate 224 are positioned at different levels. It should be noted that the conductive column 230 is preferably fabricated from a metallic material to provide electrical power and additional mechanical strength to the package 202. In other words, the first substrate 222 and the second substrate 224 are electrically connected through the conductive column 230 so that signal may be directly transmitted from the first substrate 222 to the second substrate 224 and vice versa.

The lead-frame 240 has a plurality of leads 242, a plurality of down-set portions 244 and a plurality of up-set portions 246. The down-set portion 244 is connected to the first substrate 222 by soldering. The up-set portion 246 extends into the back surface 224b of the second substrate 224 so that the up-set portion 246 is able to connect with the back surface 224b of the second substrate 224 by soldering. Because the up-set portion 246 of the lead-frame 240 extends inwards toward the back surface 224b of the second substrate 224, the second substrate 224 has an area almost equal to or smaller than the first substrate 222 so that overall size of the package 202 can be reduced. Furthermore, the leads 242 connect to (or extend from) the down-set portion 244 or the up-set portion 246 of the lead-frame 240.

The molding compound 250 encapsulates the first elements 212, part of the first substrate, part of the second substrate 224, the conductive columns 230 and the down-set portion 244 and the up-set portion 246 of the lead-frame 240. Before or after forming the encapsulating layer 250, an additional heat sink (not shown) may be attached to an exposed or designated surface of the first substrate 222 to increase the heat-dissipating capacity of the package 202.

It should be noted that the top end of the conductive columns 230 and the contact area in the up-set portion 246 for connecting with the second substrate 224 could be exposed when the encapsulating layer 250 is formed. Thereafter, the contacts (not shown) on the back surface 224b of the second substrate 224 are soldered to the top end of the conductive columns 230 and the contact area on the up-set portion 246 of the lead-frame 240 respectively. In this way, the second elements 214 and the second substrate 224 can be electrically tested prior to assembly for increasing overall yield.

In addition, before the molding compound 250 encloses the entire front surface 224a of the second substrate 224 as shown in FIG. 3, the molding compound 250 must completely fill the space between the second substrate 224 and the up-set portion 246. This increases the creeping distance D and prevents any high voltage arc discharge between the leads 242 and the second substrate 224.

Figure 4:
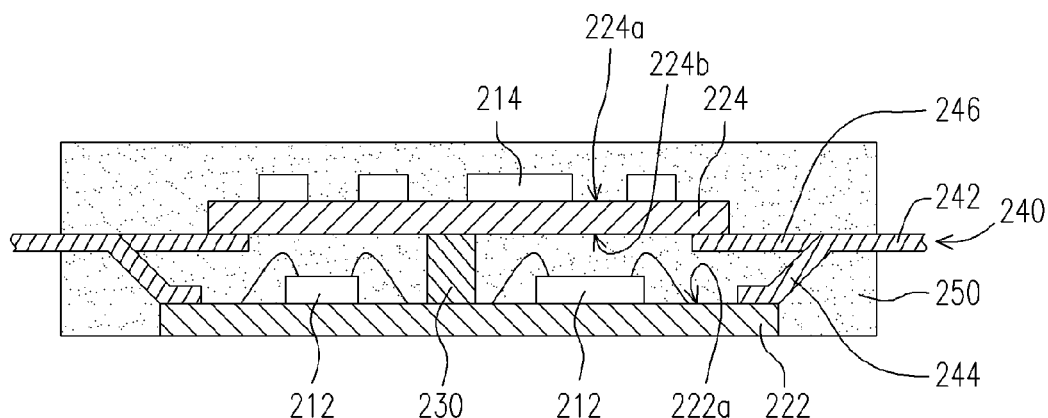
FIG. 4 is a schematic cross-sectional view of another package with stacked substrates according to an embodiment of the present invention.

FIG. 4 is a schematic cross-sectional view of another stacked substrate package according to an embodiment of the present invention. Instead of exposing the second elements 214 and the front surface 224a of the second substrate 224, the molding compound 250 may completely enclose the second elements 214. It should be noted that if the second elements 214 and the second substrate 224 were electrically connected together by conductive wires, the molding compound 250 would also enclose the conductive wires.

It should be noted that only two substrates are used in the embodiment of the present invention. However, the present invention also permits the stacking of three or more substrates together to form a package and the use of one or more conductive columns between any two neighboring substrates within the package. Furthermore, aside from using the up-set portion of a lead-frame to connect with any extra substrates, the present invention also permits the down-set portion or the up-set portion of other lead-frames to connect with the substrates when three or more substrates are used. Beside a power source module, the design concept of the present invention can also be applied to form the package of other high power modules.

In summary, the package with stacked substrates of the present invention has at least the following advantages:

1. With at least two stacked substrates, a three-dimensional circuit structure is formed. Furthermore, the average signal transmission path is reduced through the conductive columns that connect different substrates. Ultimately, the transmission quality is improved and electrical performance of the package is upgraded.

2. The addition of conductive columns between two neighboring substrates increases the mechanical strength of the package significantly so that warping due to thermal stress is minimized and the package can have a longer life.

3. The one or more extra up-set portions of the lead-frame that extend into and solder to a surface (for example, the back surface) of the upper substrates renders the upper substrates having an area almost equal to or smaller than the lower substrate. Hence, the flat area of the package is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package with stacked substrates, comprising:
a first substrate, having a first surface;
at least a first element, connected to the surface of the first substrate;
at least a conductive column, such that one end of the conductive column is connected to the surface of the first substrate;
a second substrate, having a front surface and a back surface such that the back surface of the second substrate is connected to the other end of the conductive column, wherein the second substrate and the first substrate are located at different levels;
at least a second element, connected to the front surface or the back surface of the second substrate;
a lead-frame, having at least a lead, at least a down-set portion and at least an up-set portion such that the down-set portion is connected to the first substrate and the up-set portion is connected to the second substrate; and
a molding compound, encapsulating part of the first substrate, the first element, the conductive column, part of the second substrate, and the down-set portion and the up-set portion of the lead-frame.

2. The package of claim 1, wherein the first substrate is selected from a group consisting of printed circuit board (PCB), ceramic substrate, direct copper bonded (DCB) substrate, direct aluminum bonded (DAB) substrate and insulated metal substrate (IMS).

3. The package of claim 1, wherein the first element comprises a power source element.

4. The package of claim 1, wherein the first element and the surface of the first substrate are connected through wire bonding or surface mount technology.

5. The package of claim 1, wherein the two ends of the conductive column are connected to the first substrate and the second substrate respectively by soldering.

6. The package of claim 1, wherein a material of the conductive column includes metal.

7. The package of claim 1, wherein the second substrate has an area equal to or smaller than the first substrate.

8. The package of claim 1, wherein the second substrate is selected from a group consisting of a printed circuit board (PCB), a ceramic substrate, a direct copper bonded (DCB) substrate, a direct aluminum bonded (DAB) substrate and an insulated metal substrate (IMS).

9. The package of claim 1, wherein the lead of the lead-frame is attached to the down-set portion or the up-set portion.

10. The package of claim 1, wherein the up-set portion of the lead-frame extends to the back surface of the second substrate and solders with the back surface of the second substrate.

11. The package of claim 1, wherein the second element comprises a control element or a passive element.

12. The package of claim 1, wherein the second element and the front surface of the second substrate are connected through wire bonding or surface mount technology.

13. The package of claim 1, wherein the molding compound also encapsulates the second element when the second element is connected to the back surface of the second substrate.

14. The package of claim 1, wherein the molding compound also encapsulates the second element when the second element is connected to the front surface of the second substrate.

* * * * *